United States Patent
Stokes et al.

(10) Patent No.: US 6,841,406 B2
(45) Date of Patent: Jan. 11, 2005

(54) METHODS AND APPARATUS FOR A SEMICONDUCTOR DEVICE

(76) Inventors: Edward Brittain Stokes, 2631 Rosendale Rd., Niskayuma, NY (US) 12309; Danielle Marie Walker, 621 C Englemore Rd., Clifton Park, NY (US) 12065; Xian-an Cao, 1005 London Square Dr., Clifton Park, NY (US) 12065; Steven Francis LeBoeuf, 2150 Rosa Rd., Apt. C-7-C, Schenectady, NY (US) 12309

( * ) Notice: Subject to any disclaimer, the term of this patent is extended or adjusted under 35 U.S.C. 154(b) by 209 days.

(21) Appl. No.: 09/682,998

(22) Filed: Nov. 6, 2001

(65) Prior Publication Data

US 2003/0087461 A1 May 8, 2003

(51) Int. Cl.⁷ .............................................. H01L 21/00
(52) U.S. Cl. .......................................... 438/22; 438/46
(58) Field of Search .............................. 438/22, 23, 24, 438/46, 47, 37

(56) References Cited

U.S. PATENT DOCUMENTS

| | | | |
|---|---|---|---|
| 5,536,953 A | 7/1996 | Dreifus et al. | |
| 5,585,957 A | * 12/1996 | Nakao et al. | ............... 359/248 |
| 5,625,634 A | 4/1997 | Ukita et al. | |
| 5,644,156 A | * 7/1997 | Suzuki et al. | ............... 257/485 |
| 5,696,389 A | 12/1997 | Ishikawa et al. | |
| 5,739,554 A | 4/1998 | Edmond et al. | |
| 5,764,672 A | 6/1998 | Ukita et al. | |
| 5,920,409 A | 7/1999 | Chadi et al. | |
| 6,020,602 A | 2/2000 | Sugawara et al. | |
| 6,120,600 A | 9/2000 | Edmond et al. | |
| 6,177,674 B1 | 1/2001 | Rutt et al. | |
| 6,198,091 B1 | * 3/2001 | Forrest et al. | ........... 250/214.1 |
| 6,221,684 B1 | 4/2001 | Sugawara et al. | |
| 6,235,548 B1 | 5/2001 | Ota et al. | |
| 6,297,495 B1 | 10/2001 | Bulovic et al. | |

* cited by examiner

*Primary Examiner*—Long Pham
*Assistant Examiner*—(Vikki) Hoa B. Trinh
(74) *Attorney, Agent, or Firm*—Armstrong Teasdale

(57) ABSTRACT

A method for increasing carrier concentration in a semiconductor includes providing a group III nitride semiconductor device, determining a wavelength that increases carrier concentration in the semiconductor device, and directing at least one infrared light source, at the determined wavelength, into a semiconductor device excitation band.

14 Claims, 3 Drawing Sheets

METHODS AND APPARATUS FOR A SEMICONDUCTOR DEVICE

BACKGROUND OF INVENTION

This invention relates generally to semiconductor devices and more specifically to enhancing carrier concentration in a semiconductor device.

Some known semiconductor devices, such as light emitting diodes (LED), are fabricated from a group III nitride material, such as, a compositional alloy of the nitrides of Indium, Aluminum, Galium (InAlGaN). Such devices are sometimes doped with an acceptor species such as, but not limited to, magnesium (Mg) to increase free carrier concentration and therefore increase electrical conductivity.

The group III-nitride system, GaN, AlN, InN and their solid solutions, is of increasing importance in the development of optoelectronic and electronic semiconductor devices, such as light emitting diodes, lasers and heterojunction bipolar transistors. In some known semiconductor devices a p-type dopant, such as Mg, is used as a dopant for the group III-nitride materials. Mg exhibits a relatively large thermal activation energy of approximately 200 milli-electron volts (meV). Having this activation energy may result in the ionization of only a few percent of the acceptor atoms in the material at room temperature as dictated by the Fermi-Dirac statistical energy distribution. Thus, large concentrations of Mg may be required to achieve the p-type conductivity necessary for many device applications.

In some known InAlGaN devices, using Mg as a p-dopant, the InAlGaN p-type materials may require thermal activation to dissociate Mg—H complexes which form during the process of growing the p-AlInGaN material. Even after disassociation removes the hydrogen, leaving Mg dopant atoms behind, the Mg acceptor levels are typically a few hundred milli-electron volts (meV) from a valence band edge in the semiconductor device. This problem may worsen in LED's and laser diodes, as the concentration of aluminum is increased to move the emission wavelength from blue-green wavelength into an ultraviolet wavelength. Therefore, at ambient temperatures there are relatively few thermally activated holes available in the p-type AlInGaN material.

SUMMARY OF INVENTION

In one embodiment, a method for determining a wavelength to improve carrier concentration in a semiconductor device is provided. The method includes providing a group III nitride semiconductor device and irradiating the semiconductor device with a broad band light source to generate a semiconductor device response, wherein the semiconductor device response includes at least one of a photocurrent in a p-type layer and an electroluminescence emission from a light emitting device. The method also includes identifying at least one wavelength corresponding to an acceptor ionization in the semiconductor device based on at least one of the photocurrent and the electroluminescence emission.

In another embodiment, a method for increasing carrier concentration in a semiconductor device is provided. The method includes providing a group III nitride semiconductor device, determining a wavelength that increases carrier concentration in the semiconductor device, and directing at least one infrared light source, at the determined wavelength, into a semiconductor device excitation band.

In a further embodiment, an apparatus for increasing carrier concentration in a semiconductor device is provided. The apparatus includes a group III nitride semiconductor device and at least one infrared radiation source optically coupled to the semiconductor device.

DETAILED DESCRIPTION

Figure 1:
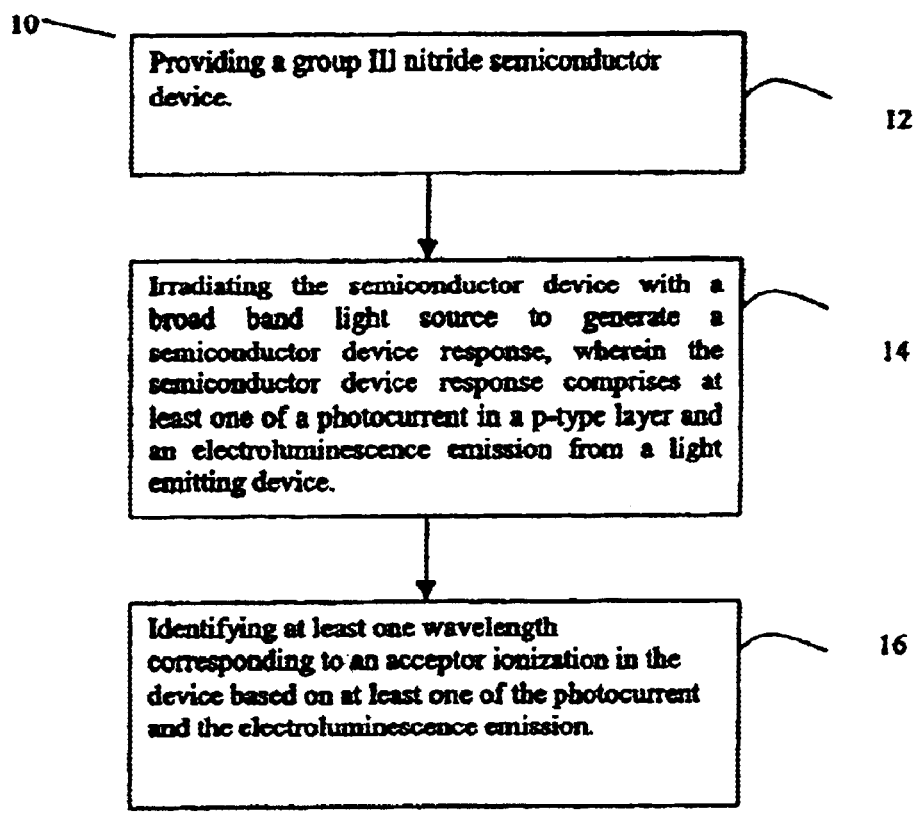
FIG. 1 is a method for determining a wavelength to increase carrier concentration in a semiconductor device.

FIG. 1 is a method 10 for determining a wavelength to increase carrier concentration in a semiconductor device. Method 10 includes providing 12 a group III nitride semiconductor device and irradiating 14 the semiconductor device with a broad band light source to generate a semiconductor device response, wherein the semiconductor device response includes at least one of a photocurrent in a p-type layer and an electroluminescence emission from a light emitting device. In one embodiment, the broad band light source is an infrared light source, such as, but not limited to, a tunable infrared light source such as a dispersive infrared spectrometer. In another embodiment, the broad band light source is an interferometer including a spatially oscillating mirror, such as a Fourier transform infrared spectrometer (FTIR). In one embodiment, the broad band light source is used to photoionize acceptor dopant atoms, thereby forming a non-equilibrium excess of holes in the valence band of the p-type material. Method 10 also includes identifying 16 at least one wavelength corresponding to an acceptor ionization in the semiconductor device based on at least one of the photocurrent and the electroluminescence emission. In one embodiment, identifying 16 at least one wavelength to enhance carrier concentration includes observing an enhanced response of some aspect of the semiconductor device, i.e. the enhancement caused by the increased hole concentration in the p-type material.

In one embodiment, providing 12 a group III nitride semiconductor device includes providing a semiconductor device fabricated from at least one group III material including Boron, Aluminum, Gallium, Indium, and Thallium, such as, but not limited to, an Indium Aluminum Gallium Nitride (InAlGaN) device. In one embodiment, providing 12 a group III nitride semiconductor device includes providing a semiconductor device with a bandgap width greater than 1.5 eV.

In one embodiment, the p-type semiconductor material in the device is doped with a p-type dopant, such as, but not limited to Magnesium (Mg). In an alternative embodiment, the p-type semiconductor material in the device is doped with a material such that an acceptor and donor energy level is greater than 40 meV. Irradiating 14 the semiconductor device with a broadband tunable dispersive IR or FTIR interferometric light source to generate a semiconductor device emission includes, but is not limited to, radiating the semiconductor device with a Fourier transform infrared (FTIR) spectroscopy device. The FTIR device measures the dominant energies of crystal lattice vibrations, i.e. phonons, crystal intersubband transitions, local impurity vibrational modes, and an acceptor ionization of the semiconducting samples. FTIR spectrometers normally record the interaction of infrared radiation with the semiconductor device to measure the frequencies at which the sample absorbs the radiation and also the intensities of the absorptions.

In an exemplary embodiment, the magnitude of photocurrent in a layer of p-type material is measured as a function of infrared wavelength, wherein the preferred wavelength is the wavelength of peak photocurrent, and the resulting infrared spectrum is the acceptor ionization FT-photocurrent spectrum.

In another embodiment, the magnitude of electroluminescence emission of a double heterostructure, single quantum well, or multiple quantum well AlInGaN light emitting diode (LED) is measured as a function of infrared wavelength, wherein the preferred wavelength is the wavelength of peak emission intensity, and the resulting infrared spectrum is the infrared-electroluminescence spectrum. The FTIR spectra are referred to as FT-photocurrent or FT-electroluminescence.

In use, the semiconductor device's electroluminescence or photocurrent is analyzed to determine a wavelength that increases carrier concentration. For example, III-nitride materials represent a class of wide bandgap semiconductors, with the most common gallium nitride GaN having an ambient temperature bandgap of approximately 3.4 electron volts (eV), wherein the bandgap is defined as the distance between a valence band and a conduction band. As the temperature of an undoped semiconductor device increases, the thermal energy of the electrons increase, allowing more electrons to cross the bandgap from the practically full valence band into the practically empty conduction band. In wide bandgap materials, such as GaN, the quantity of electrons crossing the bandgap is relatively small at room temperature. When an electron is excited from the valence band to the conduction band it leaves behind a vacancy which behaves as a second carrier of positive charge, referred to herein as a hole. As electrons drift through the semiconductor in an electric field, holes drift in the opposite direction. Holes and electrons created in this way are known as intrinsic charge carriers. In a doped semiconductor, the electrons or holes are excited not from the valence and conduction bands respectively, but rather from donor states, such as silicon, or acceptor states, such as magnesium, in the forbidden gap, then the charge carriers are extrinsic charge carriers, and the semiconductor is referred to as n-type or p-type depending on whether the majority of carriers are electrons or holes respectively. A carrier concentration is the number of charge carriers per unit volume. For wide bandgap semiconductors, the band-to-band transition has the energy of visible or ultraviolet light, while the donor and acceptor ionization energies have the energy of infrared light. Whether intrinsic or doped, the product of the number of electrons and the number of holes in a particular semiconductor is equal to a constant, i.e., the square of the intrinsic electron (and hole) concentration.

Identifying 16 at least one wavelength corresponding to an acceptor ionization in the device based on at least one of the photocurrent in a layer of p-type material and the electroluminescence emission from a heterostructure light emitting diode (LED) includes analyzing the photocurrent or the electroluminescence to identify a wavelength corresponding to an optimal acceptor ionization wavelength, wherein the acceptor is a p-type dopant or an n-type dopant. In one embodiment, the exemplary wavelength has an energy between approximately 50 meV and approximately 1000 meV. In another embodiment, the exemplary wavelength has an energy which is approximately 20% of a bandgap width for the semiconductor device, such as 0.68 eV for a GaN semiconductor device. Identifying 16 at least one wavelength corresponding to an acceptor ionization in the device based on at least one of the photocurrent emission and the electroluminescence emission also includes using a Fourier transform hardware mathematical algorithm to identify at least one wavelength corresponding to the acceptor ionization in the semiconductor device. Alternatively, any acceptable mathematical algorithm can be used to identify at least one wavelength corresponding to the acceptor ionization. In another embodiment, the FTIR can identify a plurality of wavelengths corresponding to a plurality of acceptor ionization energies.

Figure 2:
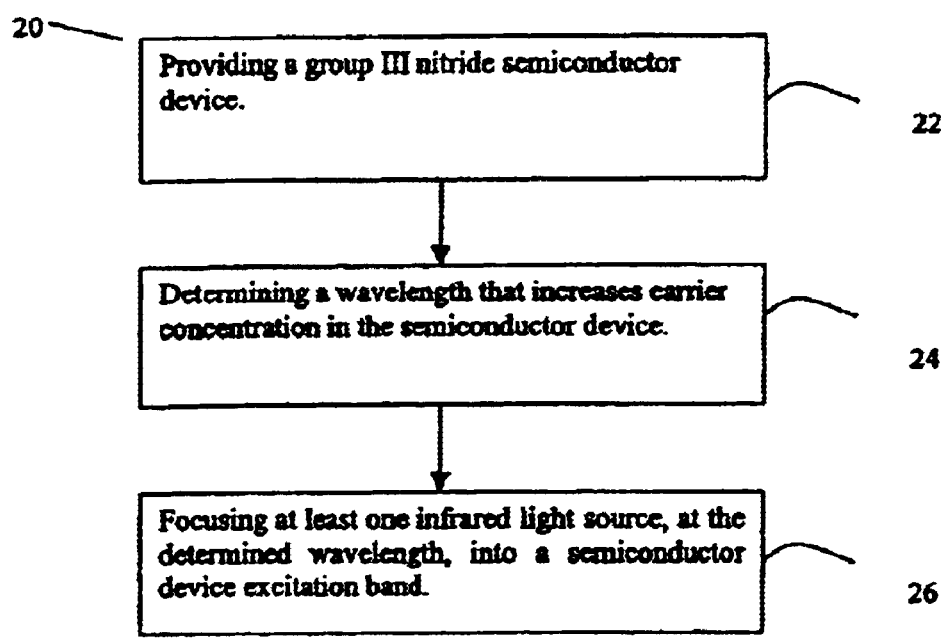
FIG. 2 is a method for increasing carrier concentration in a semiconductor device.

FIG. 2 is a method 20 for increasing carrier concentration in a semiconductor device. Method 20 includes providing 22 a group III nitride semiconductor device, determining 24 a wavelength that increases carrier concentration in the semiconductor device, and directing 26 at least one infrared light source, at the determined wavelength, into a semiconductor device, donor or acceptor, excitation band. In one embodiment, method 20 includes providing 22 a group III nitride semiconductor device, and determining 24 a wavelength that increases carrier concentration in accordance with method 10 described herein.

Figure 3:
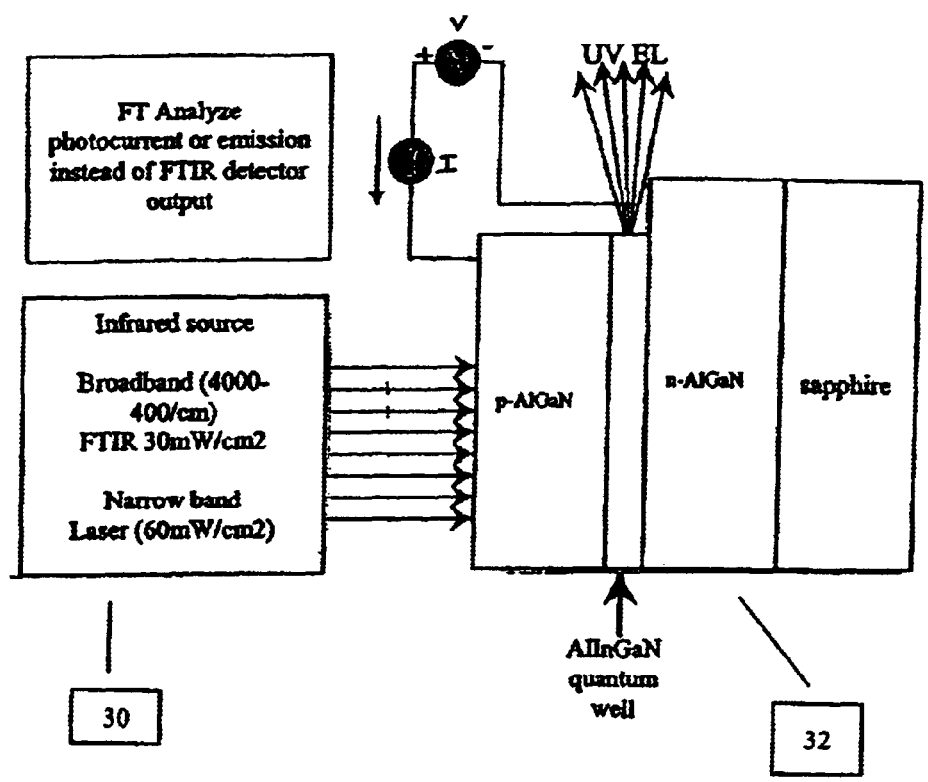
FIG. 3 is a pictorial view of an infrared light source and a semiconductor device in an exemplary embodiment of the invention.

FIG. 3 is a pictorial view of an infrared light source 30 and a semiconductor device 32, such as a light emitting diode, in an exemplary embodiment of the invention. In one embodiment, infrared light source 30 is a laser. In another embodiment, infrared light source 30 is variably selected depending on the wavelength identified corresponding to a donor or an acceptor ionization in semiconductor device 32. In one embodiment, semiconductor device 32 is a forward-biased heterostructure light emitting diode such as, but not limited to, an Indium Aluminum Gallium Nitride (InAlGaN) device. In another embodiment, semiconductor device 32 is a laser diode, GaN based bipolar junction transistor (BJT), a pin diode, and an ultraviolet emitter.

In use, infrared light source 30 is positioned such that a radiation beam is directed toward semiconductor device 32. In one embodiment, infrared light source 30 is located at any position such that infrared light source 30 and semiconductor device 32 are optically coupled. In another embodiment, a plurality of infrared light sources 30 are optically coupled to semiconductor device 32. In one embodiment, infrared light source 30 and semiconductor device 32 are non-unitary devices optically coupled. In one embodiment, infrared light source 30 is a laser diode, such as, but not limited to, an edge emitter laser diode, or a vertical emitter laser diode. In one embodiment, semiconductor device 32 receives the infrared radiation from the top (shown in FIG. 4). In another embodiment, semiconductor device 32 receives the infrared radiation from the side (not shown). Radiating semiconductor device 32 from the top facilitates implementation of the method since a lateral dimension of the p-type material in a heterostructure III-nitride light emitting device is typically two orders of magnitude larger than a thickness. Alternatively, radiating semiconductor device 32 from the side may facilitate a larger fraction of infrared light being absorbed by the p-type material, since the infrared optical path length in the p-type layer is two orders of magnitude longer (re: Beer's Law). In an alternative embodiment, infrared light source 30 and semiconductor device 32 are unitary, i.e., fabricated as a single semiconductor device including infrared light source 30 and semiconductor device 32, such as, but not limited to a heterostructure light emitting diode and a laser diode. Infrared light source 30 is then directed, at the determined wavelength, into a semiconductor device excitation band. In a p-type layer, a plurality of electrons undergo photoexcitation from the valence band to acceptor levels, i.e. approximately 0.1 eV to approximately 0.5 eV, thereby freeing a plurality of holes in the valence band. After being transported by diffusion and drift into the active layers of the device, the plurality of holes then recombine radiatively with electrons from the n-type layer, thereby generating higher intensity electroluminescence emission at a nominal bias. In an exemplary embodiment, semiconductor device 32 emits an ultraviolet electroluminescence. In an alternative embodiment, semiconductor device 32 emits a visible light electroluminescence.

In other words, semiconductor device 32 has a current applied to it that causes semiconductor device 32 to emit ultraviolet radiation at a normal level when not exposed to infrared radiation. However, since most p-type dopants are too deep to fully excite into the valence band at operating temperatures, exposing semiconductor device 32 to infrared radiation from infrared light source 30 provides the photonic energy to facilitate exciting holes, in the p-type material, from deep acceptor levels into the valence band. This excitation facilitates radiative recombination in the active layers with electrons from the n-type material in the conduction band, which causes semiconductor device 32 to emit ultraviolet radiation at a level greater than the normal level.

In use, directing light source 30 at semiconductor device 32 increases an internal quantum efficiency and an external quantum efficiency of the heterostructure, but may reduce a plug efficiency of a combined system, i.e., infrared light source 30 and semiconductor device 32.

While the invention has been described in terms of various specific embodiments, those skilled in the art will recognize that the invention can be practiced with modification within the spirit and scope of the claims.

What is claimed is:

1. A method for determining a wavelength to improve carrier concentration in a semiconductor device, said method comprising:
   providing a group III nitride semiconductor device;
   irradiating the semiconductor device with a broad band light source to generate a semiconductor device response, wherein the semiconductor device response comprises at least one of a photocurrent in a p-type layer and an electroluminescence emission from a light emitting device; and
   identifying at least one wavelength corresponding to an acceptor ionization in the semiconductor device based on at least one of the photocurrent and the electroluminescence emission.

2. A method in accordance with claim 1 wherein the semiconductor device comprises a semiconductor light emitting device (LED).

3. A method in accordance with claim 1 wherein the semiconductor light emitting device comprises an Indium Aluminum Gallium Nitrogen (InAlGaN) heterostructure LED.

4. A method in accordance with claim 1 wherein the semiconductor device comprises a laser diode.

5. A method in accordance with claim 1 wherein identifying at least one wavelength corresponding to an acceptor ionization in the device comprises identifying at least one wavelength having an energy between approximately 50 milli-electron volts and approximately 1000 milli-electron volts.

6. A method in accordance with claim 1 wherein identifying at least one wavelength corresponding to an acceptor ionization in the device comprises identifying at least one wavelength having an energy approximately twenty percent of a bandgap width of the semiconductor device.

7. A method for determining a wavelength to improve carrier concentration in a semiconductor device, said method comprising:
   providing a group III nitride semiconductor device, wherein said semiconductor device comprises a laser diode and an Indium Aluminum Gallium Nitrogen (InAlGaN) light emitting diode (LED);
   irradiating the semiconductor device with a laser to generate a semiconductor device response, wherein the semiconductor device response comprises at least one of a photocurrent and an electroluminescence emission; and
   analyzing at least one of the photocurrent and the electroluminescence emission with a mathematical algorithm to identity at least one wavelength corresponding to an acceptor ionization in the device, wherein said wavelength has an energy between approximately 50 milli-electron volts and approximately 1000 milli-electron volts.

8. A method for increasing carrier concentration in a semiconductor device, said method comprising:
   providing a group III nitride semiconductor device;
   determining a wavelength that increases carrier concentration in the semiconductor device; and
   directing at least one infrared light source, at the determined wavelength, into a semiconductor device excitation band.

9. A method in accordance with claim 8 wherein determining a wavelength to improve carrier concentration in the semiconductor device comprises:
   irradiating the semiconductor device with a broad band light source to generate a semiconductor device response, wherein the semiconductor device response comprises at least one of a photocurrent and an electroluminescence emission; and
   analyzing at least one of the photocurrent and the electroluminescence emission with a mathematical algorithm to identify at least one wavelength corresponding to an acceptor ionization in the device.

10. A method in accordance with claim 8 wherein directing at least one infrared light source comprises directing a laser, at the determined wavelength, into a semiconductor device acceptor excitation band.

11. A method in accordance with claim 8 wherein the semiconductor device comprise a semiconductor light emitting device (LED).

12. A method in accordance with claim 8 wherein the semiconductor light emitting device comprises an Indium Aluminum Gallium Nitrogen (InAlGaN) LED.

13. A method in accordance with claim 8 wherein the semiconductor device comprises a laser diode.

14. A method for increasing carrier concentration in a semiconductor device, said method comprising:
   providing a group III nitride semiconductor device, wherein said semiconductor device comprises a laser diode and an Indium Aluminum Gallium Nitrogen (InAlGaN) heterostructure light emitting diode (LED);
   irradiating the semiconductor device with a broad band light source to generate a semiconductor device response, wherein the semiconductor device response comprises at least one of a photocurrent and an electroluminescence emission;
   analyzing at least one of the photocurrent emission and the electroluminescence emission with a mathematical algorithm to identify at least one wavelength corresponding to an acceptor ionization in the device; and
   directing a laser, at the determined wavelength, into a semiconductor device excitation band.

* * * * *

UNITED STATES PATENT AND TRADEMARK OFFICE
CERTIFICATE OF CORRECTION

PATENT NO. : 6,841,406 B2  Page 1 of 1
APPLICATION NO. : 09/682998
DATED : January 11, 2005
INVENTOR(S) : Stokes et al.

It is certified that error appears in the above-identified patent and that said Letters Patent is hereby corrected as shown below:

Claim 7, column 6, line 3, delete "identity" and insert therefore -- identify --.

Claim 11, column 6, line 35, after "device" delete "comprise" and insert therefor -- comprises --.

Signed and Sealed this

Third Day of April, 2007

JON W. DUDAS
*Director of the United States Patent and Trademark Office*